United States Patent
Lee et al.

(10) Patent No.: US 11,824,081 B2
(45) Date of Patent: Nov. 21, 2023

(54) DIELECTRIC THIN FILM, INTEGRATED DEVICE INCLUDING THE SAME, AND METHOD OF MANUFACTURING THE DIELECTRIC THIN FILM

(71) Applicants: Samsung Electronics Co., Ltd., Suwon-si (KR); AJOU UNIVERSITY INDUSTRY-ACADEMIC COOPERATION FOUNDATION, Suwon-si (KR)

(72) Inventors: Changsoo Lee, Seoul (KR); Sangwoon Lee, Suwon-si (KR); Chan Kwak, Yongin-si (KR); Hyungjun Kim, Suwon-si (KR); Euncheol Do, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 106 days.

(21) Appl. No.: 17/209,762

(22) Filed: Mar. 23, 2021

(65) Prior Publication Data
US 2022/0085144 A1 Mar. 17, 2022

(30) Foreign Application Priority Data
Sep. 15, 2020 (KR) .................. 10-2020-0118378

(51) Int. Cl.
*H01L 49/02* (2006.01)
*H01L 27/108* (2006.01)
(Continued)

(52) U.S. Cl.
CPC .............. *H01L 28/55* (2013.01); *C04B 35/01* (2013.01); *C04B 35/057* (2013.01);
(Continued)

(58) Field of Classification Search
CPC ....... H01L 28/55; C04B 35/01; C04B 35/057; C04B 35/495; C04B 35/64
See application file for complete search history.

(56) References Cited

U.S. PATENT DOCUMENTS

2013/0293263 A1* 11/2013 Kurokawa ........ H01L 27/11803
326/41
2016/0068990 A1 3/2016 Spanier et al.
(Continued)

FOREIGN PATENT DOCUMENTS

KR 10-2005-0116492 A 12/2005
WO WO-2019-079062 A1 4/2019

OTHER PUBLICATIONS

Kai-Erik Elers et al., "NbCl5, as a precursor in atomic layer epitaxy," Appl. Surf. Sci., vol. 82-83, pp. 468-474, Jul. 9, 1994.
(Continued)

*Primary Examiner* — Karl E Group
*Assistant Examiner* — Cameron K Miller
(74) *Attorney, Agent, or Firm* — HARNESS, DICKEY & PIERCE, P.L.C.

(57) ABSTRACT

Provided are a dielectric thin film, an integrated device including the same, and a method of manufacturing the dielectric thin film. The dielectric thin film includes an oxide having a perovskite-type crystal structure represented by Formula 1 below and wherein the dielectric thin film comprises 0.3 at % or less of halogen ions or sulfur ions.

$$A_{2-x}B_{3-y}O_{10-z} \qquad \text{<Formula 1>}$$

In Formula 1, A, B, x, y, and z are disclosed in the specification.

27 Claims, 13 Drawing Sheets

(51) Int. Cl.
| | |
|---|---|
| *C04B 35/057* | (2006.01) |
| *C04B 35/01* | (2006.01) |
| *C04B 35/64* | (2006.01) |
| *C04B 35/495* | (2006.01) |
| *H10B 12/00* | (2023.01) |

(52) U.S. Cl.
CPC ............ *C04B 35/495* (2013.01); *C04B 35/64* (2013.01); *H10B 12/038* (2023.02); *H10B 12/37* (2023.02)

(56) References Cited

U.S. PATENT DOCUMENTS

2016/0096751 A1* 4/2016 Curran .................. H01G 11/32 205/742
2018/0286586 A1* 10/2018 Jung ..................... C04B 35/495

OTHER PUBLICATIONS

Kjell Knapas et al., "Etching of Nb2O5 Thin Films by NbCl5," Chem. Vap. Deposition, vol. 15, pp. 269-273, Dec. 17, 2009.

Yeji Song et al., "Supporting information: Massive hydration-driven swelling of layered perovskite niobate crystals in aqueous solutions of organo-ammonium bases," Dalton Trans., vol. 47, pp. 3022-3028, Year 2018.

Young-Shin Lee, et al., "Dielectric properties of single crystal Sr2Nb3O10 dielectric nanosheet thin films by electrophoretic deposition (EPD) and post deposition treatments," J. Alloys. Compounds, vol. 711, pp. 51-57, Mar. 31, 2017.

Bao-Wen Li et al., "Atomic Layer Engineering of High?? Ferroelectricity in 2D Perovskites," J. Am. Chem. Soc. 2017, vol. 139, pp. 10868-10874, Jul. 12, 2017.

Sang Woon Lee et al., "Role of Interfacial Reaction in Atomic Layer Deposition of TiO2 Thin Films Using Ti(O-iPr)2(tmhd)2 on Ru or RuO2 Substrates," Chemistry of Materials, vol. 23, No. 4, pp. 976-983, Jan. 6, 2011.

Sang Hyo Kweon et al., "Physical Properties of (Na1-xKx)NbO3 Thin Film Grown at Low Temperature Using Two-Dimensional Ca2Nb3O10 Nanosheet Seed Layer," Applied Materials & Interfaces, vol. 10, pp. 25536-25546, Jul. 9, 2018.

Woong-Hee Lee et al., "Synthesis of Sr2Nb3O10 nanosheets and their application for growth of thin film using an electrophoretic method," Journal of the American Ceramic Society, vol. 100, pp. 1098-1107, Mar. 2017.

* cited by examiner

DIELECTRIC THIN FILM, INTEGRATED DEVICE INCLUDING THE SAME, AND METHOD OF MANUFACTURING THE DIELECTRIC THIN FILM

CROSS-REFERENCE TO RELATED APPLICATION

This application is based on and claims priority under 35 U.S.C. § 119 to Korean Patent Application 10-2020-0118378, filed on Sep. 15, 2020, in the Korean Intellectual Property Office, the disclosure of which is incorporated by reference herein in its entirety.

BACKGROUND

1. Field

The present disclosure relates to dielectric thin films, integrated devices including the same, and methods of manufacturing the dielectric thin films.

2. Description of the Related Art

With the development of various compact and high-performance electronic devices in recent years, there is an increasing demand for compact and high-performance electronic devices for use in various electronic circuits. Such electronic circuits may include a plurality of metal insulator metal (MIM) capacitors and metal oxide semiconductor (MOS) transistors, and there is a need to develop a dielectric thin film having high permittivity, a low leakage current even at a small thickness, a low impurity content, and a uniform surface to realize compactness, large capacity, and high performance of these electronic devices.

SUMMARY

Provided are dielectric thin films including an oxide having a perovskite-type crystal structure and having high permittivity, low leakage current, a low impurity content, and a uniform surface.

Provided are integrated devices including the dielectric thin films.

Provided are methods of manufacturing the dielectric thin films.

Additional aspects will be set forth in part in the description which follows and, in part, will be apparent from the description, or may be learned by practice of the presented embodiments of the disclosure.

According to an aspect of an embodiment, a dielectric thin film may include an oxide including a perovskite-type crystal structure and represented by Formula 1 below.

$$A_{2-x}B_{3-y}O_{10-z}$$ <Formula 1>

Wherein in Formula 1, A is a divalent cation, B is a pentavalent cation, 0≤x≤0.5, 0≤y≤0.5, and 0≤z≤0.5, and wherein the dielectric thin film comprises 0.3 at % or less of halogen ions or sulfur ions.

The halogen ions or sulfur ions may comprise 0.1 at % to 0.3 at % of the dielectric thin film based on analysis by X-ray fluorescence spectrometry (XRF) or X-ray photoelectron spectroscopy (XPS).

A may be Ca, Sr, Ba, or a combination thereof.

B may be V, Nb, Ta, or a combination thereof.

The oxide represented by Formula 1 may include $Sr_2Nb_3O_{10}$, $Sr_2Nb_3O_{9.5}$, $Ca_2Nb_3O_{10}$, $Ca_2Nb_3O_{9.5}$, $Ba_2Nb_3O_{10}$, $Ba_2Nb_3O_{9.5}$, $Sr_2Ta_3O_{10}$, $Sr_2Ta_3O_{9.5}$, $Ca_2Ta_3O_{10}$, $Ca_2Ta_3O_{9.5}$, $Ba_2Ta_3O_{10}$, $Ba_2Ta_3O_{9.5}$, or a combination thereof.

The dielectric thin film may include a cubic-type, orthorhombic-type, or tetragonal-type structure and a lattice constant of 3.6 Å to 4.1 Å.

The dielectric thin film may include layers aligned in an in-plane direction.

The dielectric thin film may have a thickness of 1.5 nm to 100 nm.

The dielectric thin film may have a surface roughness $R_q$ of 0.2 nm or less.

The dielectric thin film may have a single nanosheet structure or multi-layered nanosheet structure.

The dielectric thin film may be on a cylinder-type or trench-type structure.

Thicknesses of the dielectric thin film on a top surface, a side surfaces, and a bottom surface of the cylinder-type or trench-type structure may be the same.

The cylinder-type or the trench-type structure may include a semiconductor or dielectric.

The dielectric thin film may be on at least one surface of a substrate.

The dielectric thin film may be a deposited film formed by atomic layer deposition (ALD). The ALD may include a heat treatment performed at a 350° C. or higher. The ALD may include a reaction with a sulfide.

According to an aspect of an embodiment, an integrated device may include a first electrode; a second electrode; and the above-described dielectric thin film between the first electrode and the second electrode.

The integrated device may be included in a memory device or logic device.

The integrated device may comprise a capacitor or transistor.

According to an aspect of an embodiment, a method of manufacturing a dielectric thin film includes preparing a substrate in a chamber; forming a first thin film including a compound represented by Formula 2 below and formed on the substrate by ALD; and forming a second thin film including a compound represented by Formula 3 below and formed on the first thin film by ALD, wherein the forming of the first thin film includes a first process of forming a B element-containing sulfide intermediate phase via a reaction between a B element-containing halide precursor of Formula 2 and a sulfur-containing precursor, and a second process of forming a first thin film represented by Formula 2 via a reaction between the B element-containing sulfide intermediate phase and an oxygen-containing precursor.

$$B_{2-x'}O_{5-y'}$$ <Formula 2>

Wherein in Formula 2, B is a pentavalent cation, 0≤x'≤0.5, and 0≤y'≤0.5.

$$A_{2-z'}O_{2-2'}$$ <Formula 3>

Wherein in Formula 3, A is a divalent cation, 0≤z'≤0.5, and 0≤w'≤0.5.

B may be V, Nb, Ta, or a combination thereof.

A may be Ca, Sr, Ba, or a combination thereof.

The forming of the second thin film may include a reaction between an A element-containing precursor of Formula 3 and an oxygen-containing precursor.

The A element-containing precursor may be strontium bis(isopropylcyclopentadienyl) (Sr(iPrCp)$_2$), strontium bis (1,2,4-triisopropylcyclopentadienyl) (Sr(1,2,4-iPr$_3$Cp)$_2$), strontium bis(tri(isopropyl)cyclopentadienyl) (Sr(C$_5$iPr$_3$H$_2$)$_2$), strontium bis(pentamethylcyclopentadienyl)

(Sr(1,2,4-C$_5$Me$_5$)$_2$), strontium bis(n-propyltetramethylcyclopentadienyl) (Sr(nPrMe$_4$Cp)$_2$), strontium bis(tri-tert-butylcyclopentadienyl) Sr(tBu$_3$Cp)$_2$), or a combination thereof.

At least one of the forming of the first thin film or the second thin film may include a heat treatment at 350° C. or higher.

An average of a total thickness of the first thin film and the second thin film may be 2 nm or less.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
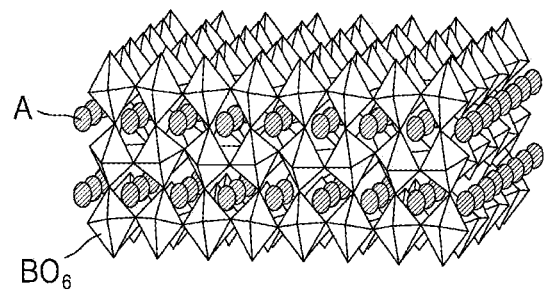
FIG. 1 is a schematic diagram illustrating a structure of a dielectric thin film according to an embodiment.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, dielectric thin films, integrated devices including the same, and methods of manufacturing the dielectric thin films according to some example embodiments of the present disclosure will be described with reference to the accompanying drawings. Accordingly, it should be apparent to those skilled in the art that the following description of various embodiments of the present disclosure is provided for illustration purpose only and not for the purpose of limiting the present disclosure as defined by the appended claims and their equivalents.

Hereinafter, an element referred to as being "above" or "on" another element may be directly on the other element in contact therewith or intervening elements may also be present.

An expression used in the singular encompasses the expression of the plural, unless it has a clearly different meaning in the context. Throughout the specification, the term "include" is intended to indicate that an element do not preclude the other elements but further add and/or intervene another element, unless otherwise stated.

As used herein, the term "combination" includes a mixture, an alloy, a reaction product, or the like unless otherwise stated.

It will be understood that, although the terms first, second, etc. may be used herein to describe various components, these components should not be limited by these terms. These terms are only used to distinguish one component from another.

As used herein, the term "cylinder-type or trench-type" includes a cylindrical shape, a trench shape, or any similar shape thereto. The "any similar shape thereto" refers to an overall shape recognized as a cylindrical or trench shape even when widths of the top and the bottom are different or lengths of both sides are different or even when, in a plan view, the cylinder-type or trench-type include shapes different from circles, oblongs, or quadrangles.

As used herein, the term "or" refers to "and/or" unless otherwise stated. As used herein, the terms "an embodiment," "embodiments," or the like indicate that elements described with regard to an embodiment are included in at least one embodiment described in this specification and may or may not present in other embodiments. In addition, it may be understood that the described elements are combined in any suitable manner in various embodiments. Unless otherwise defined, technical and scientific terms used herein have the same meaning as commonly understood by one of ordinary skill in the art to which this application belongs. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modification, variations, improvements, and substantial equivalents.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

When an electric field is applied to a dielectric material or dielectric, a dielectric polarization phenomenon in which polar molecules are aligned occurs. The degree of dielectric polarization is proportional to the electric field. The degree of dielectric polarization proportional to the applied electric field may be expressed as a permittivity. A permittivity ε of a dielectric material or dielectric may be expressed as a relative permittivity $\varepsilon_r$ as compared to a vacuum permittivity $\varepsilon_0$; the relative permittivity $\varepsilon_r$ may also be referred to as a dielectric constant. Because permittivity is not described with absolute values hereinafter, permittivity c and relative permittivity $\varepsilon_r$ may be used interchangeably.

A nanosheet having a perovskite-type crystal structure may have high permittivity that does not decrease in accordance with thickness. In general, the nanosheet having a perovskite-type crystal structure is manufactured by chemical delamination from a compound having a layered structure. The nanosheet may be, for example, two-dimensional nanosheet. The two-dimensional nanosheet may be a single-layer or half-layer solid in which atoms form a crystal structure in a two-dimensional plane. Though the atoms, units, and/or components comprising the two-dimensional nanosheet may exist above and/or below the two-dimensional plane, the two-dimensional lattice may comprise vertices ordered in a single sheet.

A two dimensional material is in contrast to a one-dimensional material (e.g., a nanowire) and/or a three-dimensional material. For example, in the case of a crystalline and/or polycrystalline three-dimensional material, the three-dimensional material would include a three-dimensional structure comprising elements and/or compounds, defining crystal units, bonded with covalent, ionic, and/or metallic bounds. The nanosheet may be manufactured in a thin film form by laminating via a layer-by-layer self assembly method or an electrophoresis method. For example, the thin film may comprise a plurality of stacked nanosheets. When the nanosheet, for example in the form of a thin film, is applied to electronic devices such as in memory devices (e.g., as components in capacitors for DRAM) the physical properties of the nanosheet may deteriorate due to residual organic materials or current leakage may occur at an interface of the nanosheet. Therefore, there is a need to develop a perovskite-type crystal structure-based dielectric thin film having a uniform surface without having deteriorated physical properties by residual organic materials.

A dielectric thin film according to an embodiment of the present disclosure may include an oxide including a perovskite-type crystal structure represented by Formula 1 below:

$$A_{2-x}B_{3-y}O_{10-z} \quad \text{<Formula 1>}$$

In Formula 1, A is a divalent cation, B is a pentavalent cation, and 0≤x≤0.5, 0≤y≤0.5, and 0≤z≤0.5. Units of the x, y, and z are atomic percent (at %).

A may be calcium (Ca), strontium (Sr), barium (Ba), or any combination thereof. For example, A may be Ca, Sr, or any combination thereof.

B may be vanadium (V), niobium (Nb), tantalum (Ta), or any combination thereof. For example, B may be Nb, Ta, or any combination thereof.

The oxide represented by Formula 1 may include $Sr_2Nb_3O_{10}$, $Sr_2Nb_3O_{9.5}$, $Ca_2Nb_3O_{10}$, $Ca_2Nb_3O_{9.5}$, $Ba_2Nb_3O_{10}$, $Ba_2Nb_3O_{9.5}$, $Sr_2Ta_3O_{10}$, $Sr_2Ta_3O_{9.5}$, $Ca_2Ta_3O_{10}$, $Ca_2Ta_3O_{9.5}$, $Ba_2Ta_3O_{10}$, $Ba_2Ta_3O_{9.5}$, or any combination thereof. For example, the oxide represented by Formula 1 may be $Sr_2Nb_3O_{10}$, $Sr_2Nb_3O_{9.5}$, $Ca_2Nb_3O_{10}$, $Ca_2Nb_3O_{9.5}$, $Sr_2Ta_3O_{10}$, $Sr_2Ta_3O_{9.5}$, $Ca_2Ta_3O_{10}$, $Ca_2Ta_3O_{9.5}$, or any combination thereof.

Figure 2:
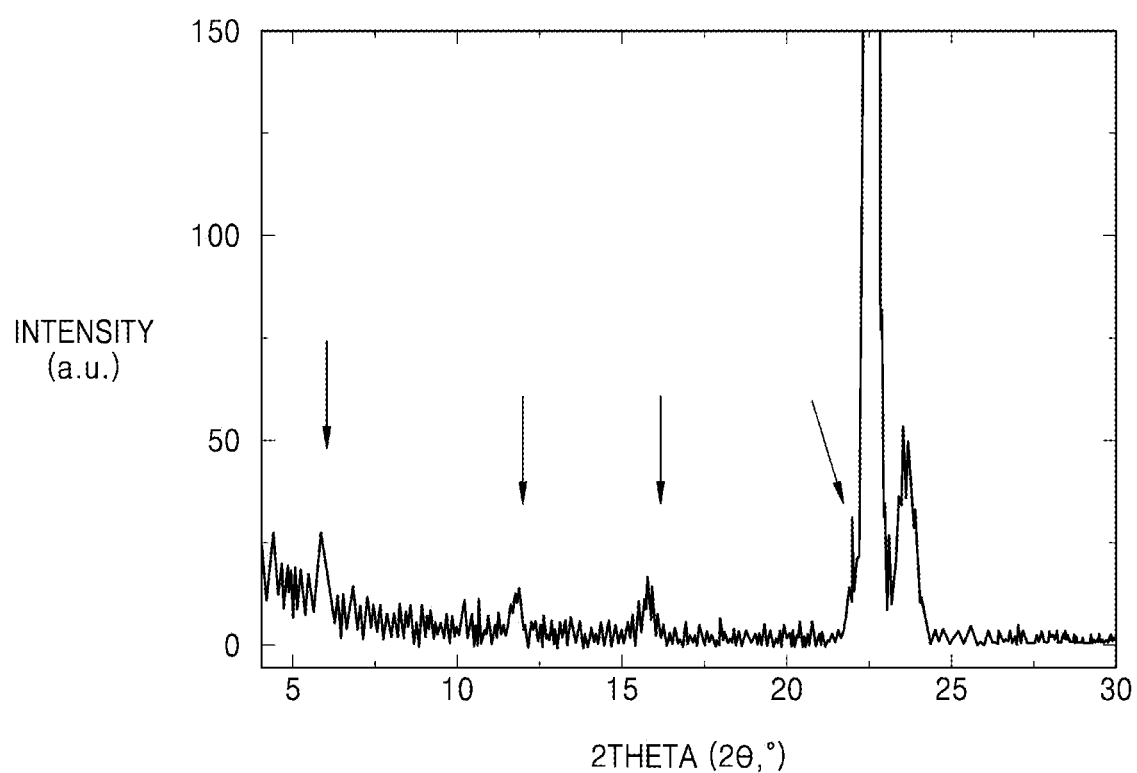
FIG. 2 shows results of x-ray diffraction (XRD) analysis of a dielectric thin film according to an embodiment.
Figure 3:
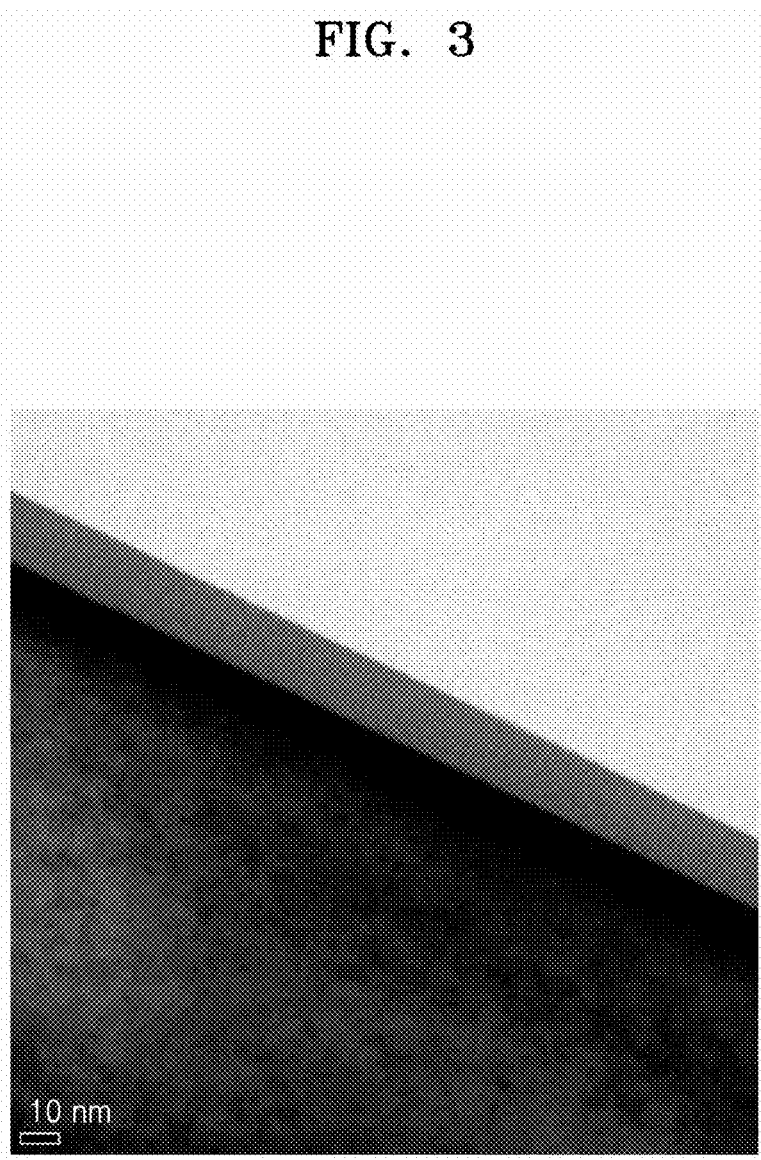
FIG. 3 is a TEM image of a dielectric thin film formed on a SrTiO$_3$ substrate according to an embodiment.

FIG. 1 is a schematic diagram illustrating a structure of a dielectric thin film according to an embodiment. FIG. 2 shows results of x-ray diffraction (XRD) analysis of a dielectric thin film according to an embodiment. FIG. 3 is a transmission electron microscope (TEM) image of a dielectric thin film according to an embodiment formed on a $SrTiO_3$ substrate.

Referring to FIG. 1, the dielectric thin film according to an embodiment includes an oxide having a perovskite-type crystal structure in which an A cation is coordinated by 12 oxygen anions to form a cubic structure and a B cation is coordinated by 6 oxygen anions to form an octahedral structure. The dielectric thin film including the oxide has a two-dimensional nanosheet structure.

The dielectric thin film may include an oxide having a cubic-type, orthorhombic-type, or tetragonal-type structure and a lattice constant of 3.6 Å to 4.1 Å.

Referring to FIG. 2, the dielectric thin film according to an embodiment shows peaks (marked with arrows) at diffraction angles (2Θ) of 5° to 8°, 11° to 14°, 15° to 18°, and 23° to 26°, respectively. Based thereon, it may be confirmed that the dielectric thin film has a two-dimensional perovskite-type crystal structure.

Referring to FIG. 3, the dielectric thin film according to an embodiment is formed on the $SrTiO_3$ substrate. The dielectric thin film may be in a layered form aligned in an in-plane direction. It may be confirmed that the dielectric thin film is in the form of a two-dimensional nanosheet.

The dielectric thin film according to an embodiment may include halogen ions or sulfur ions in an amount of 0.3 at % or less based on analysis by X-ray fluorescence spectrometry (XRF) or X-ray photoelectron spectroscopy (XPS). For example, the dielectric thin film may include halogen ions or sulfur ions in an amount of 0.1 at % to 0.3 at % based on analysis by X-ray fluorescence spectrometry (XRF) or X-ray photoelectron spectroscopy (XPS). The amount of halogen ions or sulfur ions of the dielectric thin film may, for example, be about ¹⁄₁₀ or less of that of the amount of halogen ions or sulfur ions of an alternate two-dimensional nanosheet dielectric thin film having a perovskite-type crystal structure grown in without the intermediate phase, as described below.

A thickness of the dielectric thin film may be in the range of 1.5 nm to 100 nm. The dielectric thin film according to an embodiment has high permittivity with a dielectric constant of about 200 or more and a small thickness of 100 nm or less with a low amount of impurities (e.g., halogen ions or sulfur ions).

A surface roughness, as indicated by a root mean square $R_q$ of the dielectric thin film, may be 0.2 nm or less. For example, the surface roughness $R_q$ of the dielectric thin film may be 0.18 nm or less, 0.16 nm or less, 0.14 nm or less, or 0.12 nm or less.

Figure 4:
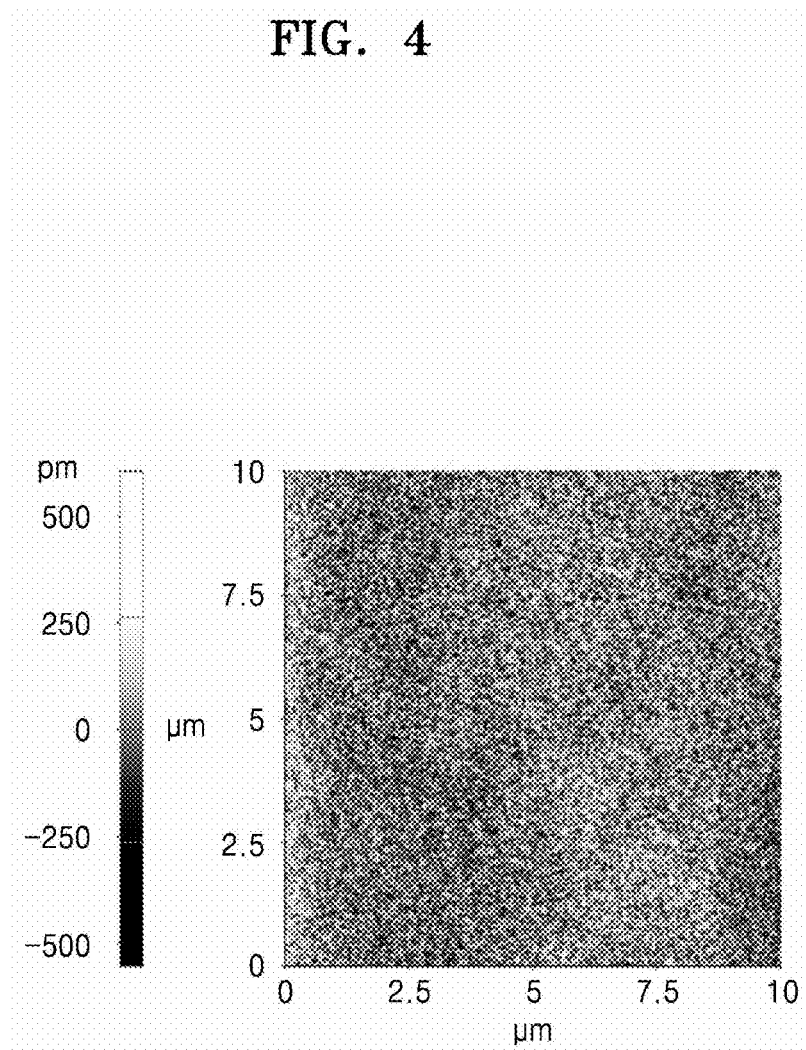
FIG. 4 shows results of AFM analysis of a dielectric thin film according to an embodiment.

FIG. 4 shows results of AFM analysis of a dielectric thin film according to an embodiment.

Referring to FIG. 4, it may be confirmed that the dielectric thin film according to an embodiment has a surface roughness $R_q$ of 0.14 nm based on results of AFM analysis. For example, the dielectric thin film may have a surface uniformity increased to about 2.5 to 5 times of that of a known two-dimensional nanosheet dielectric thin film having a perovskite-type crystal structure.

The dielectric thin film may have a single-layered or multi-layered structure.

The dielectric thin film may be formed on a cylinder-type or trench-type structure. Thicknesses of the dielectric thin film coated on the top surface, side surfaces, or bottom surface of the cylinder-type or trench-type structure may be the same.

Figure 5:
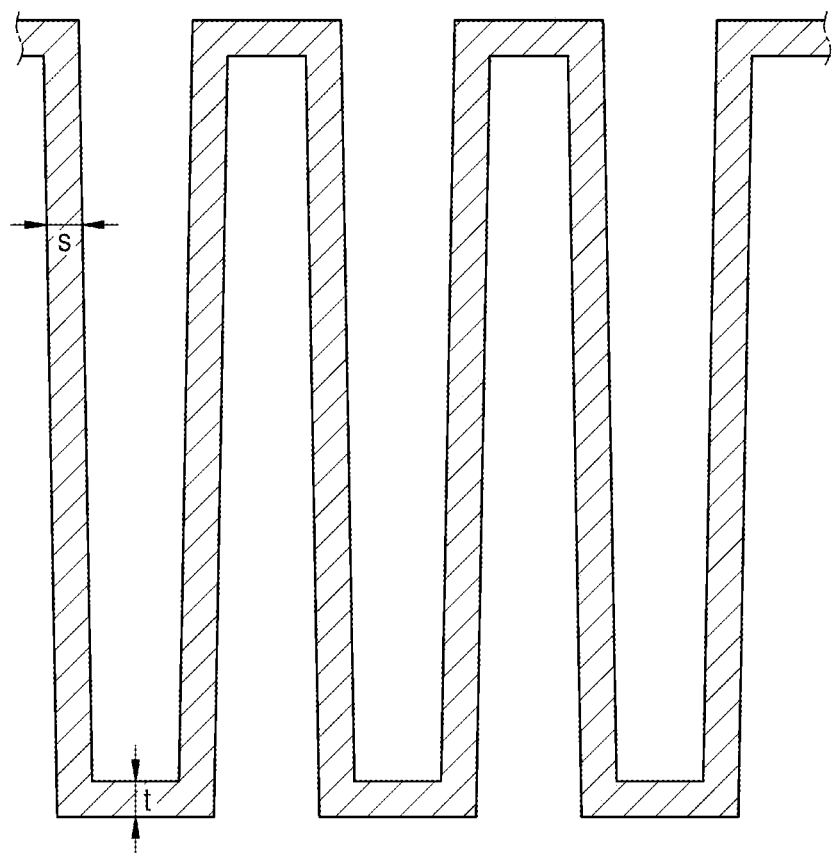
FIG. 5 is a schematic diagram illustrating a dielectric thin film coated on a cylinder-type or trench-type structure according to an embodiment.

FIG. 5 is a schematic diagram illustrating a dielectric thin film coated on a cylinder-type or trench-type structure according to an embodiment.

Referring to FIG. 5, when a thickness of the dielectric thin film coated on the bottom surface of the cylinder-type or trench-type structure is t and a thickness of the dielectric thin film coated on a side surface of the cylinder-type or trench-type structure is s, an s/t ratio may be about 1. The dielectric thin film may attain good or excellent step coverage with a uniform thickness coated on the bottom and the side surfaces of the cylinder-type or trench-type structure. Based thereon, it may be confirmed that a dielectric thin film having excellent step coverage, without a low-permittivity interfacial dead layer, may be realized even on a cylinder-type or trench-type structure having a high aspect ratio or a great hole depth.

The cylinder-type or trench-type structure may include a metal, a semiconductor, or a dielectric. For the example, the cylinder-type or trench-type structure may be included in a semiconductor or a dielectric substrate. A substrate may be the substrate of an integrated device or a growth substrate. For example, the dielectric film may be grown on the substrate of an integrated device or transferred to the substrate of an integrated device.

The dielectric thin film may be formed on at least one surface of the substrate. The dielectric thin film may be formed on the cylinder-type or trench-type structure located on at least one surface of the substrate. The substrate may include, for example silicon (Si) or germanium (Ge). The substrate may be formed of $SiO_2$ or $GeO_2$, but is not limited thereto.

The dielectric thin film may be a deposited film formed by atomic layer deposition (ALD).

Figure 6:
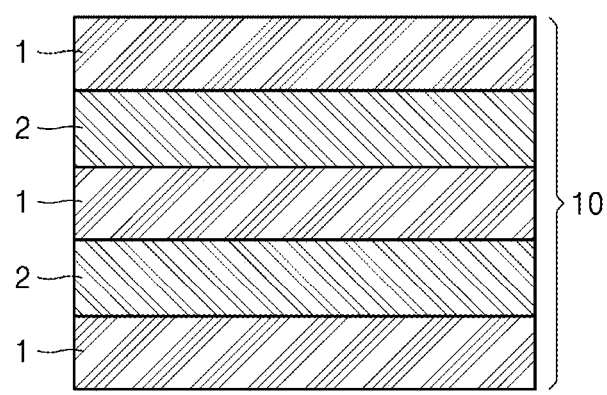
FIG. 6 is a schematic cross-sectional view of a dielectric thin film formed by atomic layer deposition (ALD) according to an embodiment.

FIG. 6 is a schematic cross-sectional view of a dielectric thin film 10 formed by atomic layer deposition (ALD).

Referring to FIG. 6, a super-cycle of the dielectric thin film 10 according to an embodiment. The dielectric thin film 10 may include a stacked structure including alternating first thin films 1 and second thin films 2. The dielectric thin film 10 is illustrated as an embodiment in which a first thin film 1, a second thin film 2, a first thin film 1, a second thin film 2, and a first thin film 1 are sequentially deposited by ALD, but the dielectric thin film 10 is not limited thereto.

The dielectric thin film may be a deposited film formed by ALD via heat treatment conducted at 350° C. or more.

The dielectric thin film may be a deposited film formed by ALD via heat treatment performed once at 350° C. or higher and reaction with a sulfide. The dielectric thin film needs to be heat-treated at a temperature of 350° C. or more to obtain high permittivity. Subsequently, a post annealing process may be further performed to reduce the impurity content of the dielectric thin film. However, by including the post annealing process, crystal defects such as interfacial voids may be formed between adjacent grains in a crystal structure, resulting in an increase in the possibility of leakage current. Therefore, the formation of a dielectric thin film including fewer impurities may include a shorter post annealing process, and thus fewer crystal defects at the interfacial voids.

The dielectric thin film according to an embodiment may be a deposited film formed by ALD via heat treatment performed once at 350° C. or higher and reaction with a sulfide. The dielectric thin film may have high permittivity, a low leakage current, a low impurity content, and a uniform surface. The dielectric thin film may be applied to electronic devices such as capacitors and memory devices and various integrated devices for integrated circuits formed on a substrate.

Figure 7:
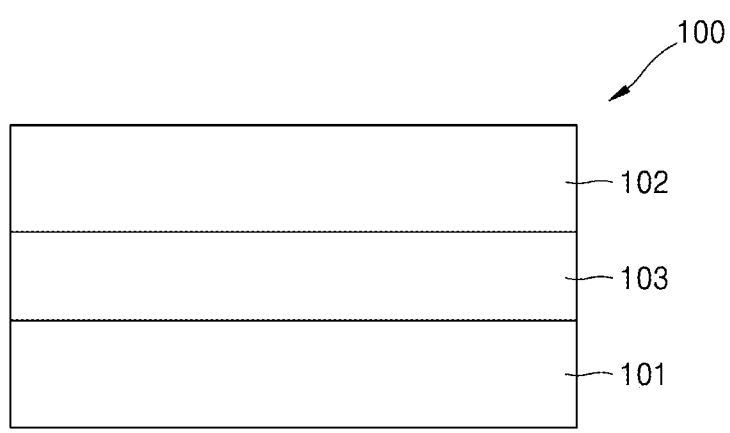
FIG. 7 is a schematic cross-sectional view of an integrated device according to an embodiment.

FIG. 7 is a schematic cross-sectional view of an integrated device according to an embodiment.

Referring to FIG. 7, an integrated device 100 according to an embodiment may include a first electrode 101; a second electrode 102; and a dielectric thin film 103 as described above interposed between the first electrode 101 and the second electrode 102.

For example, the first electrode 101 may be a lower electrode, and the second electrode 102 may be an upper electrode. On the contrary, the first electrode 101 may be an upper electrode, and the second electrode 102 may be a lower electrode.

The first electrode 101 and the second electrode 102 may include a conductive material, such as a metal, a conductive oxide, a conductive nitride, or the like. For example, a TiN electrode may be used as the first electrode 101 or the second electrode 102. However, the embodiment is not limited thereto. One of the first electrode 101 or the second electrode 102 may include a semiconductor. For example, the integrated device 100 may be included in a channel region wherein the channel includes one of the first electrode 101 or second electrode 102, the gate electrode includes the remaining electrode, and the gate dielectric includes dielectric thin film 103.

The integrated device may be included in a memory device or a logic device.

For example, the integrated device may include a capacitor or a transistor. The integrated device may be a capacitor or transistor itself, and the capacitor or the transistor may be implemented in a memory device included in a unit cell of a memory.

In this case, the dielectric thin film may be interposed between the upper electrode and the lower electrode in a single layer or in multiple layers as in various embodiments described above to obtain high permittivity even in a structure having a high aspect ratio. By including the dielectric thin film having such characteristics, various integrated devices such as quickly accessible memory devices, e.g., dynamic random access memory (DRAM) devices, variable resistance memories, ultra-fast switches, or gate dielectric layers of low voltage transistors may be implemented in addition to the capacitors.

Figure 8:
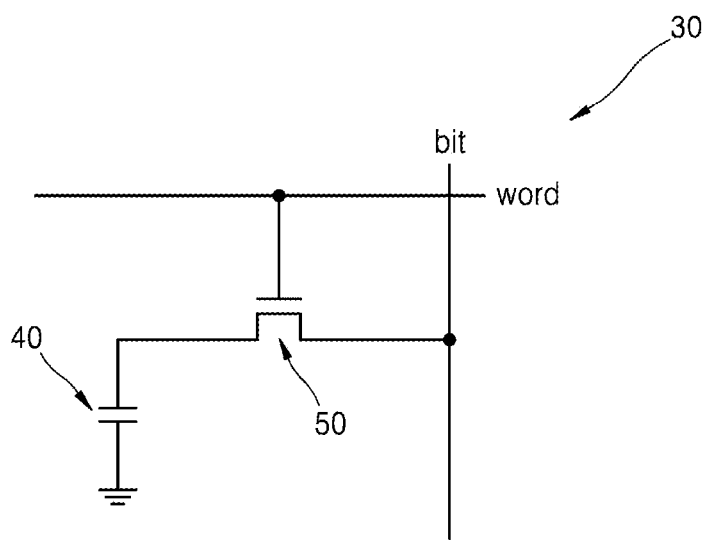
FIG. 8 is a circuit configuration of a memory cell of a memory device including a semiconductor device and a capacitor according to an embodiment.
Figure 9:
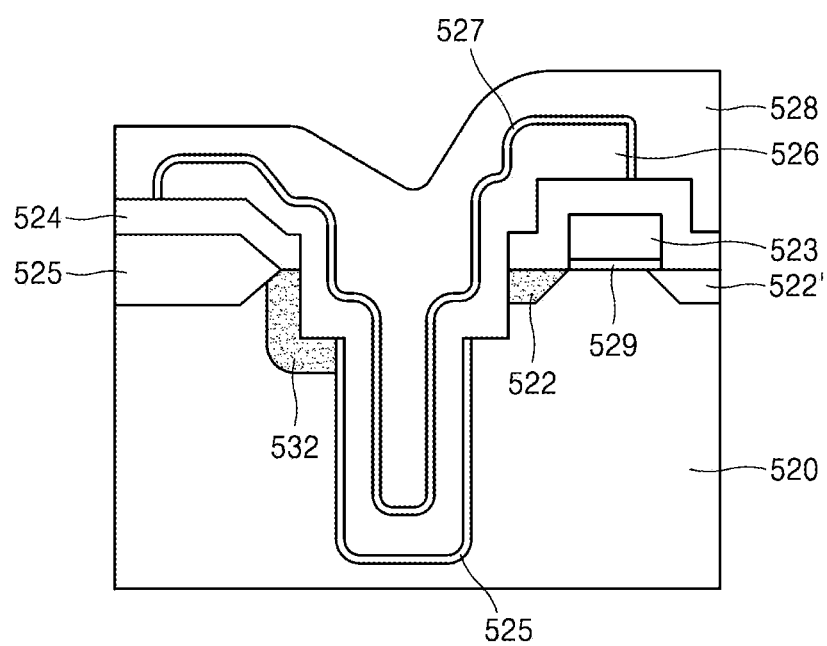
FIG. 9 is a structure of a trench capacitor-type dynamic random access memory (DRAM) according to an embodiment.

FIG. 8 illustrates a circuit configuration of a memory cell 30 of a memory device including the transistor 50 and the capacitor 40. FIG. 9 illustrates an example embodiment of an integrated circuit design including the memory cell. Referring to FIG. 8, the memory cell 30 may include the transistor 50 and the capacitor 40 electrically connected to the source region of the transistor 50. The memory device may include a plurality of bit lines and a plurality of word lines, and may further include a plurality of the memory cells illustrated in FIG. 8. Each word line may be electrically connected to the gate electrode of the transistor 50, and each bit line may be electrically connected to the drain region of the transistor 50. The first electrode of the capacitor 40 may be electrically connected to the source region of the transistor 50, and the second electrode of the capacitor 40 may be connected to a voltage controller configured to control the angular frequency of a control voltage applied to the capacitor 40.

FIG. 9 shows a structure of a trench capacitor-type dynamic random access memory (DRAM).

Referring to FIG. 9, on a semiconductor substrate 520, a device isolation region may be defined with a field oxide film and a gate electrode 523 and source/drain impurity regions 522 and 522' may be formed in the device isolation region. A gate oxide layer 529 may be formed between the gate electrode 523 and the semiconductor substrate 520. An oxide film may be formed as an interlayer insulating film 524. A region not to be a trench may be capped with a trench buffer layer, and a part of the source region 522 may be open to form a contact portion.

A trench is formed in a sidewall of the interlayer insulating film 524, and a sidewall oxide film 525 may be formed over the entire sidewall of the trench. The sidewall oxide film 525 may compensate for damage in the semiconductor substrate caused by etching to form the trench, and may serve as a dielectric film between the semiconductor substrate 520 and a storage electrode 526. A sidewall portion of part of the source region 522, except for the other part of the source region near the gate electrode 523, may be entirely exposed.

A PN junction (not illustrated) may be formed in the sidewall portion of the source region by impurity implantation. The trench may be formed in the source region 522. A sidewall of the trench near the gate may directly contact the source region 522, and the PN junction may be formed by additional impurity implantation into the source region.

A storage electrode 526 may be formed on part of the interlayer insulating film 524, the exposed source region 522, and the surface of the sidewall oxide film 525 in the trench. The storage electrode 526 may be formed to contact the entire source region 522 in contact with the upper sidewall of the trench, in addition to the part of the source region 522 near the gate electrode 523. Next, an insulating film 527 as a capacity dielectric film may be formed along the upper surface of the storage electrode 526, and a polysilicon layer as a plate electrode 528 may be formed thereon, thereby completing a trench capacitor type DRAM. The insulating film 527, and/or the interlayer insulating film 524, for example, may be an embodiment of the insulating structure IS including a ferroelectric film and a dielectric film.

The aforementioned electronic devices including an insulating structure IS including a ferroelectric film and a dielectric film may be applied to various electronic circuit devices including a transistor, for example as part of processing circuity and/or memory.

Figure 10:
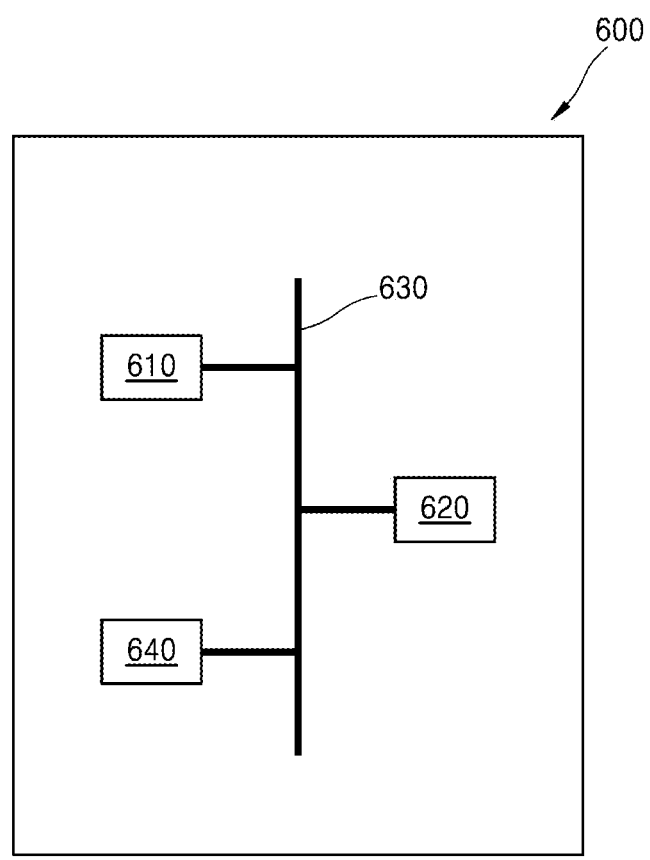
FIG. 10 is a schematic of a circuit including the electronic devices according to some example embodiments.

FIG. 10 illustrates a schematic of a circuit including the electronic devices according to some example embodiments.

As shown, the electronic device 600 includes one or more electronic device components, including a processor (e.g., processing circuitry) 610 and a memory 620 that are communicatively coupled together via a bus 630.

The processing circuitry 610, may be included in, may include, and/or may be implemented by one or more instances of processing circuitry such as hardware including logic circuits, a hardware/software combination such as a processor executing software; or a combination thereof. For example, the processing circuitry 600 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 620 may include a non-transitory computer readable storage device, for example a solid state drive (SSD), storing a program of instructions, and the processing circuitry 600 may be configured to execute the program of instructions to implement the functionality of the electronic device 600.

In some example embodiments, the electronic device 600 may include one or more additional components 640, coupled to bus 630, which may include, for example, a power supply, a light sensor, a light-emitting device, any combination thereof, or the like. In some example embodiments, one or more of the processing circuitry 610, memory 620, and/or one or more additional components 640 may include an electronic device including electrodes and an insulating structure including a ferroelectric film and a dielectric film, as described above, such that the one or more of the processing circuitry 610, memory 620, and/or one or more additional components 640, and thus, the electronic device 600, may include the transistor 50 (refer to FIG. 8), the capacitor 40 (refer to FIG. 8), and/or the memory cell 30 (refer to FIG. 8).

A method of manufacturing a dielectric thin film according to another embodiment may include: preparing a substrate in a chamber; forming a first thin film including a compound represented by Formula 2 below on the substrate by atomic layer deposition (ALD); and forming a second thin film including a compound represented by Formula 3 below on the first thin film by ALD.

                              <Formula 2>

In Formula 2, B may be a pentavalent cation, 0≤x'≤0.5, and 0≤y'≤0.5.

                              <Formula 3>

In Formula 3, A may be a divalent cation, 0≤z'≤0.5, and 0≤w'≤0.5.

B may be V, Nb, Ta, or any combination thereof. For example, B may be Nb, Ta, or any combination thereof.

A may be Ca, Sr, Ba, or any combination thereof. For example, A may be Ca, Sr, or any combination thereof.

There may be no limitations on the type of substrate in the chamber. For example, the substrate may be a metal substrate, a glass substrate, a silicone semiconductor substrate, a compound semiconductor substrate, or a plastic substrate. According to an embodiment, the substrate may be formed of $SiO_2$.

In general, metal halides may be used as precursors for forming the first thin film by ALD at 350° C. or higher. However, by reacting the metal halide with an oxygen-containing precursor, a volatile metal-oxygen-halogen compound (e.g. metal-$OCl_3$) may be formed. Accordingly, etching effects occurring on the surface of the thin film may impede formation of a uniform surface. In addition, even when the thin film is deposited, impurities may be present in halogen anions due to strong chemical bonds formed between metal cations and halogen anions.

To prevent and/or mitigate the etching effect or the presence of impurities the forming of the first thin film ($Nb_2O_5$) may include a first process of forming a B element-containing sulfide intermediate phase via a reaction between the B element-containing halide precursor of Formula 2 above and a sulfur-containing precursor, as described below, and a second process of forming a first thin film represented by Formula 2 via reaction between the B element-containing sulfide intermediate phase and an oxygen-containing precursor.

Figure 11:
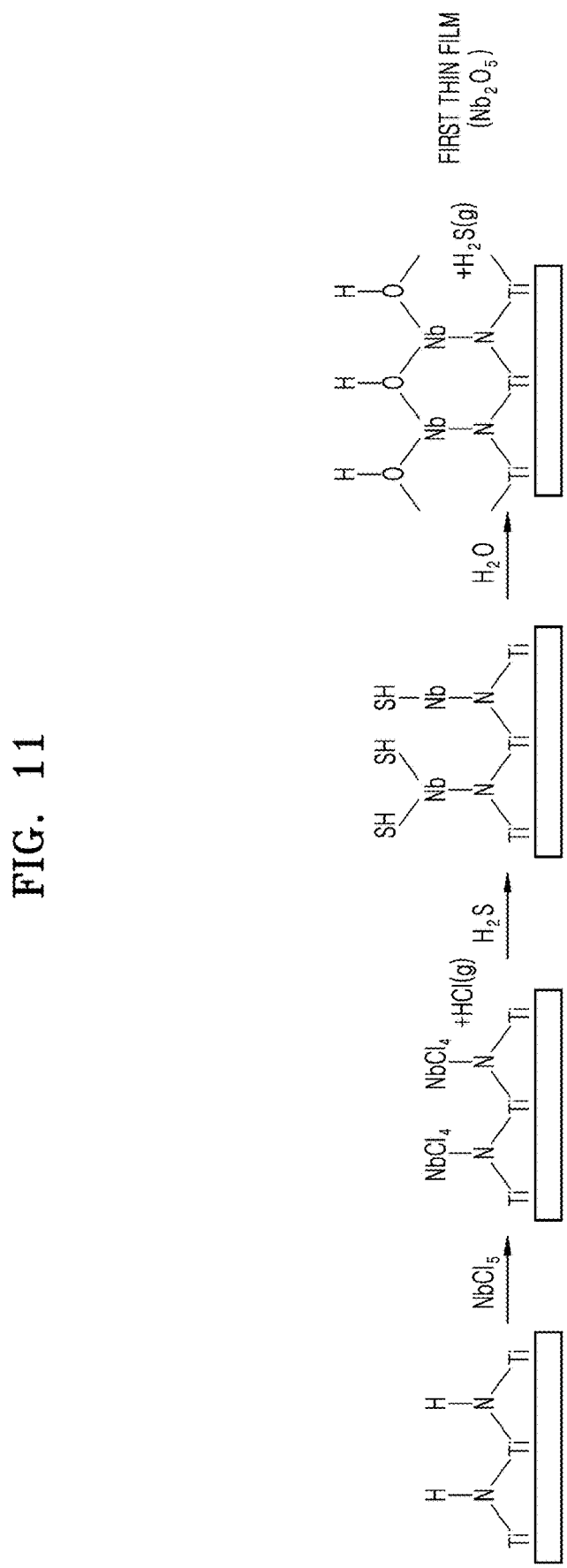
FIG. 11 is a schematic diagram illustrating a process of forming a first thin film (Nb$_2$O$_5$) in a method of manufacturing a dielectric thin film according to an embodiment.

FIG. 11 is a schematic diagram illustrating a process of forming a first thin film ($Nb_2O_5$) in a method of manufacturing a dielectric thin film according to an embodiment.

Referring to FIG. 11, a first process of forming a first thin film includes forming a B element-containing intermediate phase (e.g., a $NbS_2$) by reacting a B-element containing precursor (e.g., $NbCl_5$) with $H_2S$ on the substrate (Reaction Scheme 1), and a second process of forming the first thin film (e.g., $Nb_2O_5$) by reacting the B-element containing intermediate phase with $H_2O$ (Reaction Scheme 2) are shown.

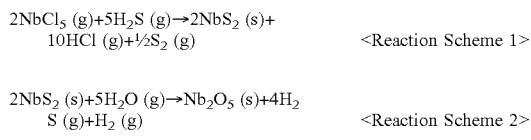

$2NbCl_5$ (g)+$5H_2S$ (g)→$2NbS_2$ (s)+
10HCl (g)+½$S_2$ (g)   <Reaction Scheme 1>

$2NbS_2$ (s)+$5H_2O$ (g)→$Nb_2O_5$ (s)+$4H_2$S (g)+$H_2$ (g)   <Reaction Scheme 2>

The process of forming the first thin film ($Nb_2O_5$) may be performed via bypass reaction using the first process of forming the B element-containing sulfide intermediate phase, and thus volatile $NbOCl_3$ may not be generated. Via the manufacturing method including the two-step process of forming the first thin film, a uniform thin film may be deposited and the amount of impurities such as halogen ions or sulfur ions in the thin film may be at or below a noise level.

The forming of the second thin film may be performed by reacting the A element-containing precursor of Formula 3 with the oxygen-containing precursor.

The A-containing precursor may be, for example, a metal-ligand containing the A element, and may include a ligand like isopropylcyclopentadienyl (iPrCp), 1,2,4-triisopropyl-cyclopentadienyl (1,2,4-iPr$_3$Cp), (isopropyl)cyclopentadienyl ($C_5iPr_3H_2$), pentamethylcyclopentadienyl (1,2,4-$C_5Me_5$), n-propyltetramethylcyclopentadienyl (nPrMe$_4$Cp)$_2$, tri-tert-butylcyclopentadienyl (tBu$_3$Cp), or any combination thereof. For example, the A-containing precursor may be strontium bis(isopropylcyclopentadienyl) (Sr(iPrCp)$_2$), strontium bis(1,2,4-triisopropylcyclopentadienyl) (Sr(1,2,4-iPr$_3$Cp)$_2$), strontium bis(tri(isopropyl)cyclopentadienyl) (Sr(C$_5$iPr$_3$H$_2$)$_2$), strontium bis(pentamethylcyclopentadienyl) (Sr(1,2,4-C$_5$Me$_5$)$_2$), strontium bis(n-propyltetramethylcyclopentadienyl) (Sr(nPrMe$_4$Cp)$_2$), strontium bis(tri-tert-butylcyclopentadienyl) (Sr(tBu$_3$Cp)$_2$), or any combination thereof. For example, the precursor may be strontium bis(isopropylcyclopentadienyl) (Sr(iPrCp)$_2$).

Figure 12:
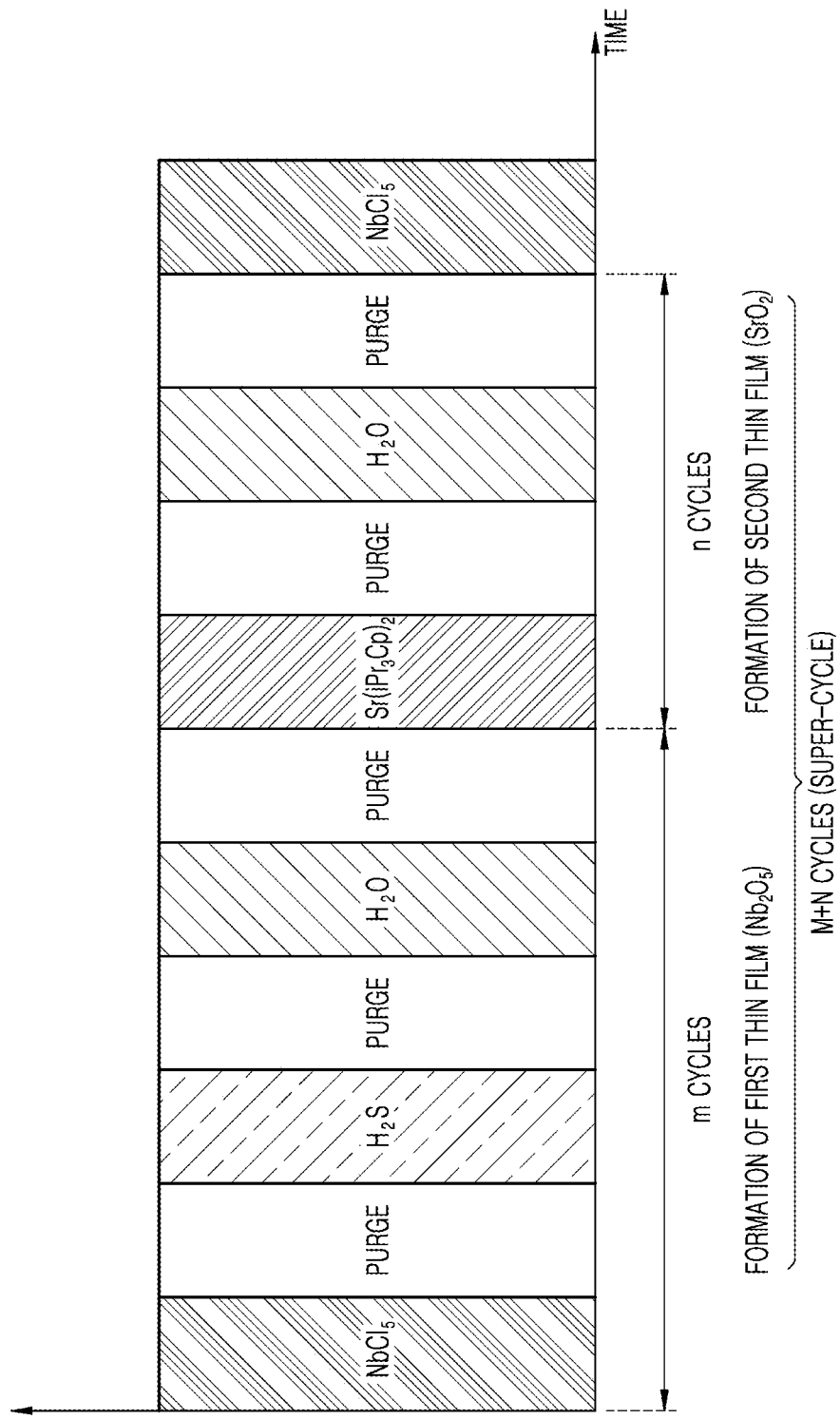
FIG. 12 is a schematic diagram illustrating a processing cycle of a method of manufacturing a dielectric thin film according to an embodiment.
Figure 13:
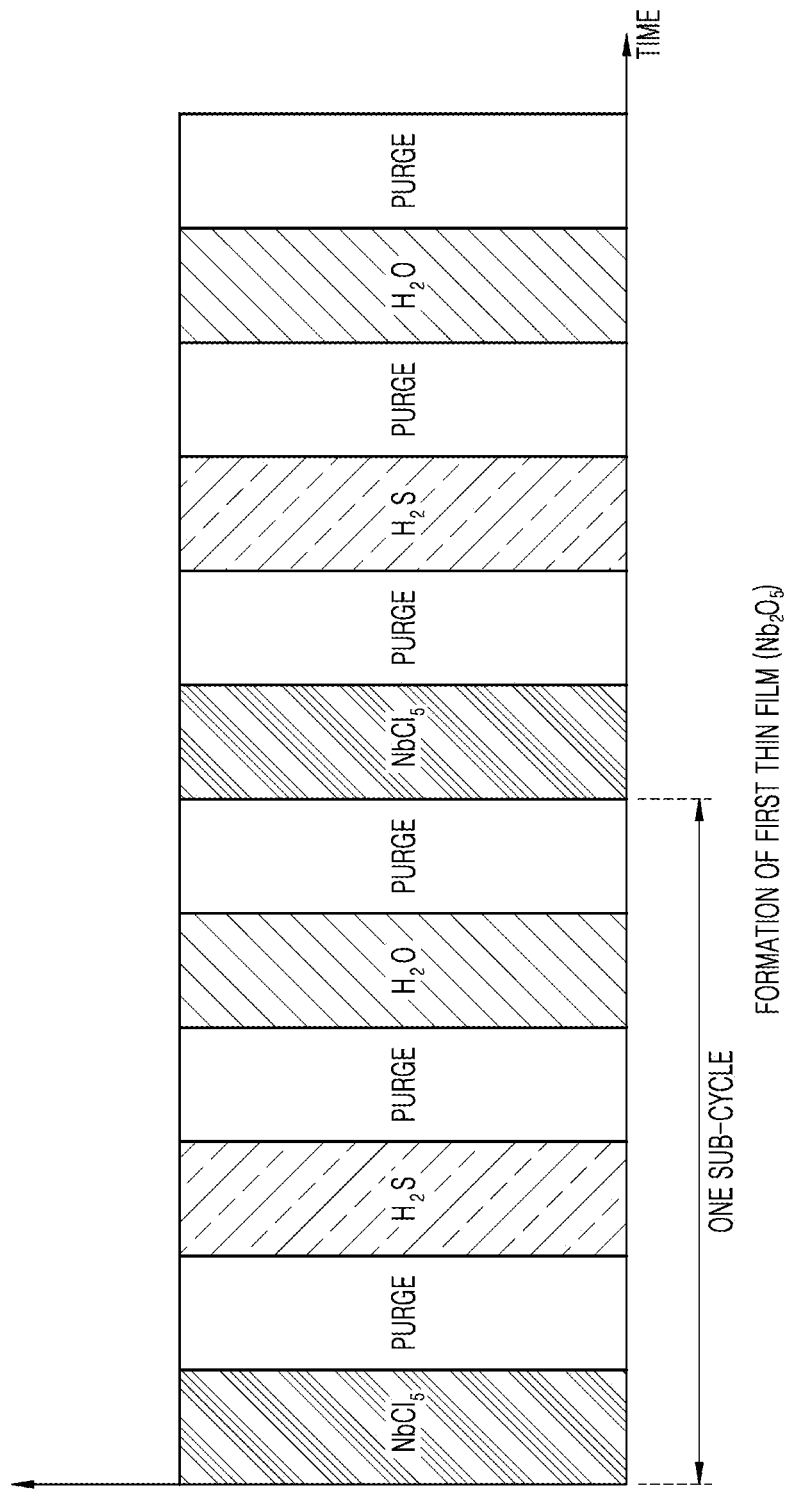
FIG. 13 is a schematic diagram illustrating a sub-cycle of forming a first thin film (Nb$_2$O$_5$) in the processing cycle of FIG. 9.

FIG. 12 is a schematic diagram illustrating a processing cycle of a method of manufacturing a dielectric thin film according to an embodiment. FIG. 13 is a schematic diagram illustrating a sub-cycle of forming a first thin film ($Nb_2O_5$) in the processing cycle of FIG. 12.

Referring to FIGS. 12 and 13, in the method of manufacturing a dielectric thin film according to an embodiment, the first thin film ($Nb_2O_5$) is formed by conducting m cycles of ALD and the second thin film ($SrO_2$) is formed by conducting n cycles of ALD. The dielectric thin film may be manufactured via m+n cycles (super-cycle) of ALD.

A sub-cycle for forming the first thin film ($Nb_2O_5$) may include a B-containing halide (e.g., $NbCl_5$) providing process; a first purge process of discharging a reaction residue of the B-containing halide (e.g., $NbCl_5$); a sulfur-containing precursor (e.g., $H_2S$) providing process; a second purge process of discharging a remainder of the sulfur-containing precursor (e.g., $H_2S$) or a reaction residue of the sulfur-containing precursor (e.g., HCl or $S_2$); an oxygen-containing precursor ($H_2O$) providing process; and a third purge process of discharging a remainder of the oxygen-containing precursor or a reaction residue of the oxygen-containing precursor (e.g., $H_2S$ or $H_2$). Though illustrated as including one sub-cycle, the m cycles for forming the first thin film ($Nb_2O_5$) may include a repetition of the sub-cycle (e.g., the one sub-cycle of FIG. 13) or a process included in the one sub-cycle. For example, any of the providing processes or purge processes may be repeated in the m cycles⁻.

A sub-cycle for forming the second thin film (e.g., $SrO_2$) may include providing an A-containing precursor (e.g., Sr(iPrCp)$_2$), a first purging of discharging a remainder of the Sr-containing precursor (e.g., Sr(iPrCp)$_2$) or a reaction residue of the Sr-containing precursor (e.g., iPrCp), providing an oxygen-containing precursor (e.g., $H_2O$), and a second purging of discharging a remainder of the oxygen-containing precursor or a reaction residue of the oxygen-containing precursor (e.g., $H_2$). Though illustrated as including one sub-cycle, the n cycles for forming the second thin film ($SrO_2$) may include a repetition of the illustrated sub-cycle or a process included in the sub-cycle. For example, any of the providing processes or purge processes may be repeated in the n cycles.

The first thin film and the second thin film may be formed by ALD. The formation may include, for example, a heat treatment performed once at 350° C. or higher. The m and n cycles may be repeated, for example, to form the dielectric thin film 10 described above. The dielectric thin film may have high permittivity, a low leakage current, a low impurity content, and a uniform surface.

An average of thicknesses for a dielectric thin film, including both the first thin film and the second thin film, may be 2 nm or less. For example, the average of the total thickness of the first thin film and the second thin film may be 1.8 nm or less, 1.6 nm or less, or 1.4 nm or less.

Figure 14:
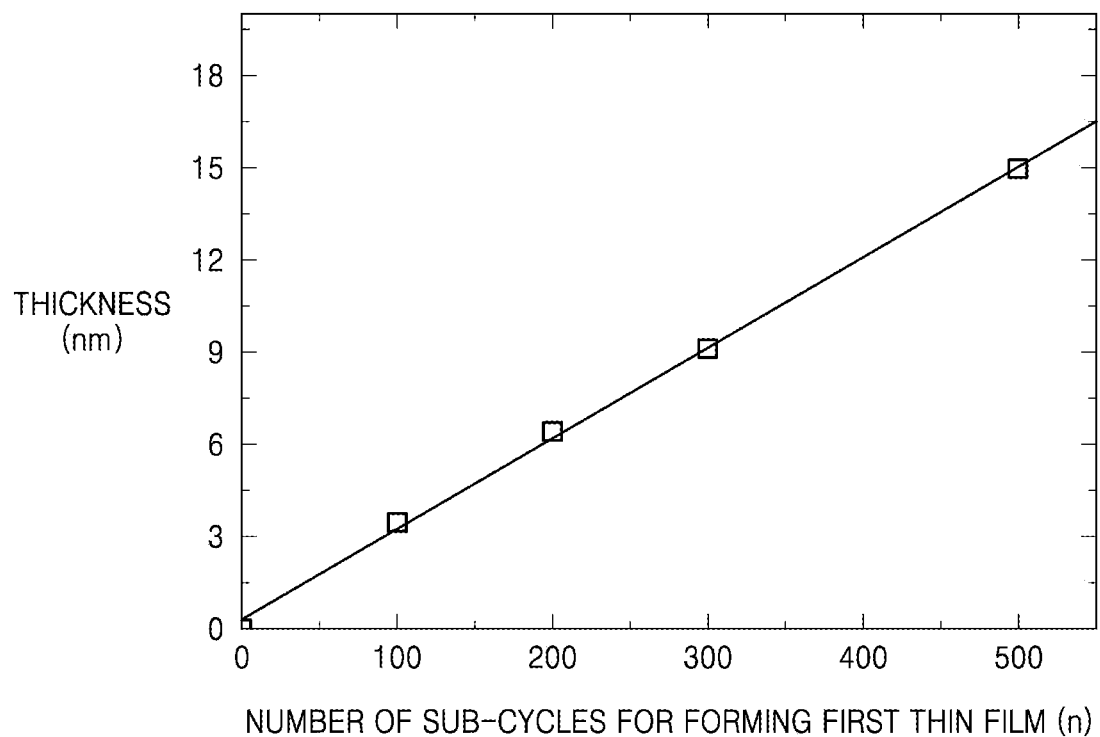
FIG. 14 is a graph illustrating thickness changes with respect to the number of sub-cycles of forming a first thin film (e.g., NbO$_x$", where 2≤x"≤2.5) in a method of manufacturing a dielectric thin film according to an embodiment.

FIG. 14 is a graph illustrating thickness changes with respect to the number of sub-cycles of forming a first thin film (e.g., NbOx", where 2≤x"≤2.5) in a method of manufacturing a dielectric thin film according to an embodiment.

Referring to FIG. 14, the thickness of the first thin film (NbOx", where 2≤x"≤2.5) formed by the method of manufacturing a dielectric thin film according to an embodiment at 350° C. or higher increased up to 500$^{th}$ cycle or more with a slope of 0.3 Å/cycle. Based thereon, it may be confirmed that the first thin film (e.g., NbOx", where 2≤x"≤2.5) is uniformly formed by ALD at 350° C. or higher.

Figure 15:
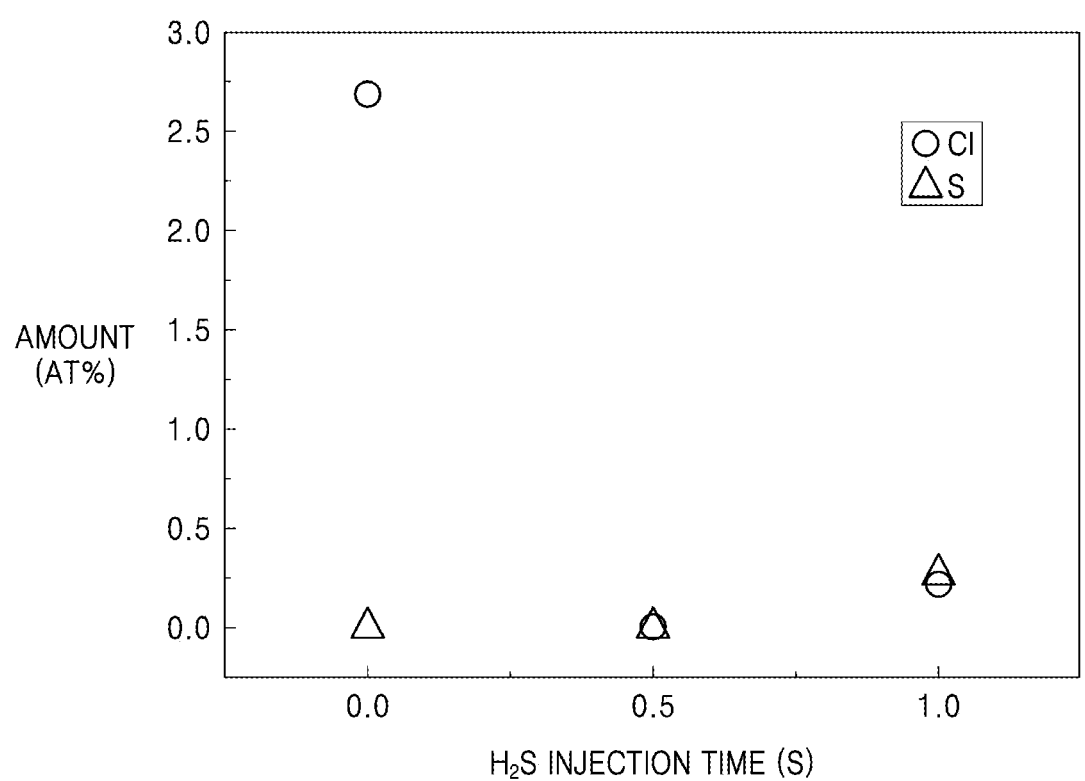
FIG. 15 is a graph illustrating an X-ray fluorescence spectrometry (XRF) analysis results showing the amounts of halogen ions and sulfur ions of a dielectric thin film prepared by a method of manufacturing a dielectric thin film according to an embodiment.

FIG. 15 is a graph illustrating an X-ray fluorescence spectrometry (XRF) analysis results showing the amounts of halogen ion (Cl, e.g., Cl⁻) and sulfur ion (S, e.g., $S^{2-}$) of a dielectric thin film prepared by a method of manufacturing a dielectric thin film according to an embodiment.

Referring to FIG. 15, it may be confirmed that the amounts of halogen ions and sulfur ions are 0.3 at % or less, respectively, in the dielectric thin film manufactured by the method of manufacturing a dielectric thin film according to an embodiment when the sulfur-containing precursor is injected for 0.5 seconds and 1 second. The dielectric thin film may be applied to electronic devices such as capacitors and memory devices and various integrated devices for integrated circuits formed on the substrate.

The dielectric thin film according to an embodiment may be a deposited film formed by ALD. The dielectric thin film may include an oxide having a perovskite-type crystal structure and have high permittivity, a low leakage current, a low impurity content, and a uniform surface with a thickness of 100 nm or less.

The above-described dielectric thin film may be applied in electronic devices such as capacitors or transistors, or in memory devices and various integrated devices for integrated circuits formed on a substrate.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric thin film comprising:
an oxide including a perovskite-type crystal structure and represented by Formula 1

$$A_{2-x}B_{3-y}O_{10-z}$$ <Formula 1> wherein in Formula 1,
A is a divalent cation,
B is a pentavalent cation,
$0 \leq x \leq 0.5$, $0 \leq y \leq 0.5$, and $0 \leq z \leq 0.5$, and
wherein the dielectric thin film comprises impurities of at least one of halogen ions or sulfur ions such that the halogen ions or the sulfur ions comprise 0.1 at % to 0.3 at % or less of the dielectric thin film based on an analysis by X-ray fluorescence spectrometry (XRF) or X-ray photoelectron spectroscopy (XPS).

2. The dielectric thin film of claim 1, wherein A is Ca, Sr, Ba, or a combination thereof.

3. The dielectric thin film of claim 1, wherein B is V, Nb, Ta, or a combination thereof.

4. The dielectric thin film of claim 1, wherein the oxide represented by Formula 1 comprises $Sr_2Nb_3O_{10}$, $Sr_2Nb_3O_{9.5}$, $Ca_2Nb_3O_{10}$, $Ca_2Nb_3O_{9.5}$, $Ba_2Nb_3O_{10}$, $Ba_2Nb_3O_{9.5}$, $Sr_2Ta_3O_{10}$, $Sr_2Ta_3O_{9.5}$, $Ca_2Ta_3O_{10}$, $Ca_2Ta_3O_{9.5}$, $Ba_2Ta_3O_{10}$, $Ba_2Ta_3O_{9.5}$, or a combination thereof.

5. The dielectric thin film of claim 1, wherein the dielectric thin film comprises a cubic-type, orthorhombic-type, or tetragonal-type crystal structure and a lattice constant of 3.6 Å to 4.1 Å.

6. The dielectric thin film of claim 1, wherein the dielectric thin film includes layers aligned in an in-plane direction.

7. The dielectric thin film of claim 1, wherein the dielectric thin film has a thickness of 1.5 nm to 100 nm.

8. The dielectric thin film of claim 1, wherein the dielectric thin film has a surface roughness $R_q$ of 0.2 nm or less.

9. The dielectric thin film of claim 1, wherein the dielectric thin film has a single nanosheet structure.

10. The dielectric thin film of claim 1, wherein the dielectric thin film has a multi-layered nanosheet structure.

11. The dielectric thin film of claim 1, wherein the dielectric thin film is on a cylinder-type or trench-type structure.

12. The dielectric thin film of claim 11, wherein thicknesses of the dielectric thin film on a top surface, side surfaces, and a bottom surface of the cylinder-type or the trench-type structure are the same.

13. The dielectric thin film of claim 12, wherein the cylinder-type or the trench-type structure includes a semiconductor or a dielectric.

14. The dielectric thin film of claim 1, wherein the dielectric thin film is on at least one surface of a substrate.

15. The dielectric thin film of claim 1, wherein the dielectric thin film is a deposited film formed by atomic layer deposition (ALD).

16. The dielectric thin film of claim 15, wherein the ALD includes a heat treatment performed at 350° C. or more.

17. The dielectric thin film of claim 16, wherein ALD includes a reaction with a sulfide.

18. An integrated device comprising:
a first electrode;
a second electrode; and
the dielectric thin film according to claim 1 between the first electrode and the second electrode.

19. The integrated device of claim 18, wherein the integrated device is included in a memory device or a logic device.

20. The integrated device of claim 18, wherein the integrated device comprises a capacitor or a transistor.

21. A method of manufacturing the dielectric thin film of the claim 1, the method comprising:
preparing a substrate in a chamber;
forming a first thin film comprising a compound, represented by Formula 2 below, on the substrate by atomic layer deposition (ALD); and
forming a second thin film comprising a compound represented by Formula 3 below, on the first thin film by ALD,
wherein the forming of the first thin film comprises a first process of forming a B element-containing sulfide intermediate phase via a reaction between a B element-containing halide precursor of Formula 2 and a sulfur-containing precursor, and
a second process of forming the first thin film represented by Formula 2 via a reaction between the B element-containing sulfide intermediate phase and an oxygen-containing precursor $$B_{2-x'}O_{5-y'}$$ <Formula 2> wherein in Formula 2, B is a pentavalent cation, $0 \leq x' \leq 0.5$, and $0 \leq y' \leq 0.5$, and $$A_{2-z'}O_{2-w'}$$ <Formula 3> wherein in Formula 3, A is a divalent cation, $0 \leq z' \leq 0.5$, and $0 \leq w' \leq 0.5$.

22. The method of claim 21, wherein B is V, Nb, Ta, or a combination thereof.

23. The method of claim 21, wherein A is Ca, Sr, Ba, or a combination thereof.

24. The method of claim 21, wherein the forming of the second thin film includes a reaction between an A element-containing precursor of Formula 3 and an oxygen-containing precursor.

25. The method of claim 24, wherein the A element-containing precursor is strontium bis(isopropylcyclopentadienyl) $(Sr(iPrCp)_2)$, strontium bis(1,2,4-triisopropylcyclopentadienyl) $(Sr(1,2,4-iPr_3Cp)_2)$, strontium bis(tri(isopropyl)cyclopentadienyl) $(Sr(C_5iPr_3H_2)_2)$, strontium bis(pentamethylcyclopentadienyl) $(Sr(1,2,4-C_5Me_5)_2)$, strontium bis(n-propyltetramethylcyclopentadienyl) $(Sr(nPrMe_4Cp)_2)$, strontium bis(tri-tert-butylcyclopentadienyl) $(Sr(tBu_3Cp)_2)$, or a combination thereof.

26. The method of claim 21, wherein at least one of the forming of the first thin film or the second thin film includes a heat treatment at 350° C. or higher.

27. The method of claim 21, wherein an average of a total thickness of the first thin film and the second thin film is 2 nm or less.

* * * * *